United States Patent
Akimoto et al.

(10) Patent No.: US 7,744,779 B2
(45) Date of Patent: Jun. 29, 2010

(54) NICKEL-RHENIUM ALLOY POWDER AND CONDUCTOR PASTE CONTAINING THE SAME

(75) Inventors: Yuji Akimoto, Fukuoka (JP); Kazuro Nagashima, Fukuoka (JP); Tetsuya Kimura, Fukuoka (JP); Yasuhiro Kamahori, Fukuoka (JP)

(73) Assignee: Shoei Chemical Inc., Tokyo (JP)

( * ) Notice: Subject to any disclaimer, the term of this patent is extended or adjusted under 35 U.S.C. 154(b) by 0 days.

(21) Appl. No.: 12/310,745

(22) PCT Filed: Sep. 25, 2007

(86) PCT No.: PCT/JP2007/068520

§ 371 (c)(1),
(2), (4) Date: Mar. 5, 2009

(87) PCT Pub. No.: WO2008/041541

PCT Pub. Date: Apr. 10, 2008

(65) Prior Publication Data

US 2010/0021735 A1 Jan. 28, 2010

(30) Foreign Application Priority Data

Oct. 2, 2006 (JP) ............................. 2006-270672

(51) Int. Cl.
*H01B 1/22* (2006.01)
*C22C 19/03* (2006.01)
*B22F 1/00* (2006.01)
*H01G 4/12* (2006.01)
*H01G 4/30* (2006.01)

(52) U.S. Cl. .................... 252/513; 420/441; 428/403

(58) Field of Classification Search ......... 252/512–514, 252/518.1; 420/441; 428/403
See application file for complete search history.

(56) References Cited

U.S. PATENT DOCUMENTS

| | | | | |
|---|---|---|---|---|
| 5,622,638 A | * | 4/1997 | Schell et al. ........... | 219/121.64 |
| 6,221,181 B1 | * | 4/2001 | Bossmann et al. ........... | 148/428 |
| 7,503,959 B2 | * | 3/2009 | Akimoto et al. ............. | 75/351 |
| 2007/0163684 A1 | * | 7/2007 | Hu ............................. | 148/528 |

FOREIGN PATENT DOCUMENTS

| | | | |
|---|---|---|---|
| CN | 1598023 | * | 3/2005 |
| JP | 11-080817 | | 3/1999 |
| JP | 11-343501 | | 12/1999 |
| JP | 2000-034531 | | 2/2000 |
| JP | 2000-045001 | | 2/2000 |
| JP | 2002-020809 | | 1/2002 |
| JP | 2002-060877 | | 2/2002 |
| JP | 2004-319435 | | 11/2004 |
| JP | 2007-138280 | | 6/2007 |
| JP | 2007-157563 | | 6/2007 |
| WO | WO 2004/070748 | | 8/2004 |

* cited by examiner

*Primary Examiner*—Mark Kopec
(74) *Attorney, Agent, or Firm*—Flynn, Thiel, Boutell & Tanis, P.C.

(57) ABSTRACT

A nickel-rhenium alloy powder comprising nickel as a main component, 0.1 to 10% by weight of rhenium, and having an average particle size of 0.05 to 1.0 μm is provided. The nickel-rhenium alloy powder has a surface oxide film containing a nickel oxide and a rhenium oxide, and the amount of oxygen in the surface oxide film is 0.1 to 3.0% by weight relative to the total weight of the powder. The nickel-rhenium alloy powder is suitable, in particular, for forming internal electrode layers of a multilayer ceramic electronic component. The obtained powder is homogeneously mixed and dispersed in an organic vehicle, together with other additives as needed, to prepare a conductor paste. The surface oxide film allows bringing the sintering shrinkage behavior of electrode layers and ceramic layers closer to each other when the nickel-rhenium alloy powder is used, in particular, for forming internal electrodes of a multilayer ceramic electronic component. Moreover, there occurs no electrode spheroidizing caused by oversintering, and thus thinner, dense internal electrodes having excellent continuity can be formed.

7 Claims, No Drawings

NICKEL-RHENIUM ALLOY POWDER AND CONDUCTOR PASTE CONTAINING THE SAME

TECHNICAL FIELD

The present invention relates to an alloy powder, containing nickel as a main component and used for conductor formation in the field of electronics. In particular, the present invention relates to a nickel-rhenium alloy powder having nickel as a main component, and to a conductor paste containing the alloy powder, that are suitable for forming internal electrodes of multilayer ceramic electronic components such as multilayer capacitors, multilayer inductors or multilayer actuators.

BACKGROUND ART

A multilayer ceramic electronic component (also referred to hereinbelow as "multilayer electronic component") is usually manufactured in the manner as follows. A ceramic raw material powder such as dielectric, magnetic, or piezoelectric material powder is dispersed in a resin binder and formed into sheets to prepare ceramic green sheets (referred to hereinbelow as "ceramic sheets"). A conductor paste for an internal electrode that is prepared by dispersing an inorganic powder comprising an electrically conductive powder as the main component and optionally a ceramic powder or the like in a vehicle comprising a resin binder and a solvent is printed according to a predetermined pattern on the ceramic sheets and dried to remove the solvent and form dry films of the inner electrodes. A plurality of ceramic sheets each having the dry film of the inner electrode that were thus obtained are laminated and pressurized to obtain a non-fired laminate in which the ceramic sheets and paste layers of inner electrodes are alternately laminated. The laminate is cut to a predetermined shape, then subjected to a binder removal process in which the binder is thermally decomposed and dissipated, and fired at a high temperature whereby sintering of the ceramic layers and formation of the inner electrode layers are conducted simultaneously and a ceramic body is obtained. Terminal electrodes are then fired to both end surfaces of the body and a multilayer electronic component is obtained. The terminal electrodes and the unfired multilayer body are sometimes co-fired.

In recent years powders of base metals such as nickel and copper are mainly used instead of powders of noble metals such as palladium and silver as electrically conductive powders of conductor pastes for inner electrodes. Accordingly, firing of the laminate is usually carried out in a non-oxidizing atmosphere with an extremely low partial pressure of oxygen in order to prevent the oxidation of the base metals during firing.

There has been in recent years an ongoing trend towards smaller multilayer electronic components having higher layer counts. In particular, ceramic layers and internal electrode layers are becoming ever thinner in multilayer ceramic capacitors using nickel as a conductive powder. However, the firing temperature of the capacitor is ordinarily of 1200° C. or higher, which may give rise to oversintering of the nickel powder in internal electrodes. This oversintering causes various problems such as large voids after firing that result in an increase in resistance and greater apparent electrode thickness through spheroidization of electrodes brought about by excessive particle growth. These problems impose limits as to how thin the internal electrodes can be.

To render the electrodes thinner, conductor pastes for internal electrodes have come to use extremely fine nickel powders having particle sizes no greater than 1 μm, and even no greater than 0.5 μm. Such fine nickel powders have high activity and a very low sintering initiation temperature. This leads to disruption of the internal electrodes, since sintering starts at an early stage of firing. Specifically, when nickel particles are fired in a non-oxidizing atmosphere, even single-crystal particles with comparatively low activity begin to sinter and shrink at a low temperature of 400° C. or lower. By contrast, the temperature at which the ceramic particles comprised in the ceramic sheet begin to sinter is generally much higher than this. When co-fired together with the internal electrode paste comprising the above nickel powder, the ceramic layers fail to shrink together with the nickel films, as a result of which the nickel films are pulled in the planar direction. The small voids generated thereby in the nickel film, through sintering at a comparatively low temperature, are believed to expand into large voids as sintering progresses at a high temperature range. Large voids forming thus in the internal electrodes may give rise to higher resistance or circuit disruption, and may lower capacitance in a capacitor.

Moreover, the sintering shrinkage behavior of the internal electrodes and the ceramic layers may fail to be matched owing to volume expansion and shrinkage brought about by oxidation and reduction reactions of nickel during firing. This mismatch gives rise to structural defects such as delamination and cracks, and detracts from yields and reliability. Moreover, fine nickel powders have high surface activity. Therefore, when binder removal is carried out in a non-oxidizing atmosphere such as a nitrogen atmosphere, the nickel powder acts as a decomposition catalyst on the vehicle, which may cause the resin to decompose explosively at a temperature lower than its ordinary decomposition temperature. In such cases, the sudden gas release give rise to cracks and delamination. Also, the suddenness of the reaction prevents the resin from dissipating completely, and, as a result, there remains a carbonaceous residue. This is believed to be behind such problems as deterioration of capacitor properties, occurrence of structural defects, and loss of reliability. Specifically, when the residual carbon remaining in the internal electrode layers after the binder removal is oxidized, gasified and dissipated during the subsequent sintering of the ceramic at high temperature, it draws oxygen from the ceramic layers, lowering thereby the strength of the ceramic body and worsening electric properties such as capacitance, insulation resistance and the like. Carbon may also give rise to oversintering by lowering the melting point of the nickel powder.

With a view to solving these problems, Patent Document 1 discloses forming internal electrodes of a multilayer ceramic capacitor by using a conductor paste containing, as a conductive powder, an alloy powder having an average particle size of 0.01 to 1.0 μm and comprising nickel as a main component, and no more than 20 mol % of at least one element from among ruthenium, rhodium, rhenium and platinum having a melting point higher than that of nickel, to curb thereby particle growth of the nickel powder at a firing stage, even when the internal electrode layers become thinner. Spheroidizing, circuit disconnection, cracks and the like can be prevented as a result, and drops in capacitance are effectively curtailed. Patent Document 2 discloses that the same effect can be achieved in a conductor paste using a powder having a coating layer that comprises at least one element from among ruthenium, rhodium, rhenium and platinum, on the surface of a nickel powder.

Furthermore, for instance Patent Document 3 discloses forming a dense oxide film, of a certain thickness, on the surface of a nickel powder, to minimize thereby the volume and weight changes caused due to reduction and oxidation of nickel during firing while raising the sintering initiation temperature and effectively preventing delamination.

Patent Document 1: WO 2004/070748
Patent Document 2: Japanese Patent Publication 2004-319435 A
Patent Document 3: Japanese Patent Publication 2000-45001 A

DISCLOSURE OF THE INVENTION

Problems that the Invention is to Solve

Among the above nickel alloy powders and coated powders nickel-rhenium alloy powders or rhenium-coated nickel powders (collectively referred to as "rhenium-containing nickel powder" hereafter), in particular, do not adversely affect the properties of dielectric materials, and allow forming thinner internal electrode layers than is the case when using pure nickel powder.

Normally, however, rhenium-containing nickel powder tends to have higher activity than pure nickel powder, and especially when its particle size is very small, sintering proceeds fast at low temperature during firing of the conductor paste and the above-described sudden resin decomposition may occur.

The present inventors have attempted to bring the sintering behavior of the rhenium-containing nickel powder yet closer to that of the ceramic layers by reducing surface activity and delaying sintering initiation through surface oxidation of the rhenium-containing nickel powder, but with variability in the results.

This variability in the results is believed to arise from the intrinsic properties of rhenium-containing nickel powder. When oxidized, specifically, rhenium sublimates characteristically at a low temperature, of about several hundreds of ° C. The above surface oxidation treatment gives rise to various problems. In the rhenium-coated nickel powder, for instance, the rhenium coating becomes oxidized and scatters on account of heating during the above surface oxidation treatment. When the proportion of rhenium is high, heating during a surface oxidation treatment gives rise to rhenium oxide, which sublimates thereupon, even in a powder in which nickel and rhenium are alloyed. These oxidation and sublimation alter the composition of the alloy, and preclude sufficiently eliciting the effect of rhenium alloying. Moreover, the oxide film formed on the surface of the nickel-rhenium alloy powder may be removed through decomposition at low temperature during firing. This is presumed to be one factor that causes a lowering in the heat resistance of the powder and an erratic sintering behavior. Moreover, decomposition of the thin surface oxide film, which oxide film has the effect of suppressing the further progress of oxidation of the powder, impairs oxidation resistance and the rhenium component oxidizes and scatters during firing, altering the alloy composition and negatively impacting on the dielectric layers, all of which is problematic.

In order to solve the above problems, it is an object of the present invention to provide a rhenium-containing nickel powder and a conductor paste using the rhenium-containing nickel powder, wherein the rhenium-containing nickel powder has low activity, even when as an extremely fine powder, such that when used for forming internal electrodes of a multilayer ceramic electronic component, for instance a multilayer ceramic capacitor or the like, the rhenium-containing nickel powder can exhibit a sintering shrinkage behavior yet closer to that of the ceramic layers, and can be prevented from undergoing oversintering at high temperature, as a result of which the rhenium-containing nickel powder allows forming thinner internal electrodes of excellent continuity. In particular, it is an object of the present invention to provide a rhenium-containing nickel powder, and a conductor paste for internal electrodes of a multilayer ceramic electronic component using the rhenium-containing nickel powder, wherein the rhenium-containing nickel powder allows manufacturing a high layer-count, small and highly reliable multilayer ceramic electronic component without causing structural defects or deterioration of electric properties such as capacitance, even when the internal electrodes are made thinner.

Means for Solving the Problems

The inventors studied the reproducible formation of a strong surface oxide film on a rhenium-containing nickel powder, the surface oxide film being thin and capable of being retained on the surface of the particles without decomposing up to certain temperature. As a result, the inventors found that in a nickel-rhenium alloy powder of a specific particle size range and having a specific composition, a good surface oxide film can be formed without virtually vaporization or dissipating of the rhenium component and impairing the properties of the alloy. The inventors found also that thin internal electrode films of excellent continuity can be formed by using a nickel-rhenium alloy powder having formed thereon such a stable surface oxide film. The present invention was perfected on the basis of these findings.

Specifically, the present invention encompasses the features below.

(1) A nickel-rhenium alloy powder comprising nickel as a main component, 0.1 to 10% by weight of rhenium, and having an average particle size of 0.05 to 1.0 μm, wherein the nickel-rhenium alloy powder has a surface oxide film comprising a nickel oxide and a rhenium oxide, and the amount of oxygen in the surface oxide film is 0.1 to 3.0% by weight relative to the total weight of the powder.

(2) The nickel-rhenium alloy powder according to (1), wherein in a TMA measurement performed by heating the nickel-rhenium alloy powder from room temperature to 1300° C. at a rate of 5° C./min in a nitrogen-hydrogen reducing atmosphere, the temperature at which the powder exhibits a 20% shrinkage rate, relative to the shrinkage rate at 1300° C., ranges from 400 to 800° C.

(3) The nickel-rhenium alloy powder according to (1) or (2), wherein a silicon oxide is present in the surface oxide film.

(4) The nickel-rhenium alloy powder according to any one of (1) to (3), wherein the nickel-rhenium alloy powder further contains sulfur.

(5) The nickel-rhenium alloy powder according to (4), wherein the sulfur segregates near the surface of the powder.

(6) The nickel-rhenium alloy powder according to (4) or (5), wherein the content of the sulfur is 100 to 2,000 ppm, in terms of sulfur atoms, relative to the total weight of the powder.

(7) A conductor paste for forming internal electrodes of a multilayer ceramic electronic component, comprising at least the nickel-rhenium alloy powder according to any one of (1) to (6), as a conductive powder.

EFFECTS OF THE INVENTION

When used for forming internal electrodes of a multilayer ceramic electronic component, since the nickel-rhenium alloy powder having a surface oxide film of the present invention delays sintering initiation and slows down sintering progress, at low temperature, during firing, and further it exhibits superior oxidation resistance, the sintering shrinkage behaviors of the electrode layers and ceramic layers are brought closer to each other. Also, there occurs no spheroidizing of electrodes caused by oversintering. As a result there are formed low-resistance thin electrodes having few voids. Therefore, in the case of, for instance, multilayer ceramic capacitors, there is no deterioration of electric properties such as a drop in capacitance or the like, and thinner internal electrode layers and ceramic layers, which allow achieving smaller sizes and higher layer counts, can be formed. Moreover, there occur few structural defects such as delamination or cracks caused due to oxidation and reduction during firing. Furthermore, the binder decomposition behavior during the binder removal step is stabilized, and there can be curbed loss of electric properties and occurrence of structural defects in the multilayer ceramic electronic component that are caused by residual carbon. As a result there can be obtained a highly reliable multilayer ceramic electronic component, with good yield, also in high layer-count multilayer articles having thin ceramic layers and internal electrode layers.

Thinner, high-continuity excellent internal electrode films can be formed, in particular, when the silicon component is present as an oxide in the surface oxide film. Furthermore, adding sulfur to the nickel-rhenium alloy powder of the present invention allows virtually suppressing the occurrence of structural defects as well as preventing deterioration of electric performance of the electronic ceramic component caused by the binder removal step.

BEST MODE FOR CARRYING OUT THE INVENTION

In the present invention the rhenium content in the nickel-rhenium alloy powder ranges from 0.01 to 10% by weight relative to the total weight of the alloy powder. A content of rhenium lower than 0.01% by weight weakens the inhibitory effect of rhenium on nickel oversintering, and makes it difficult to obtain thin internal electrodes, when the nickel-rhenium alloy powder is used, for instance, for internal electrodes of multilayer ceramic electronic components. A rhenium content in excess of 10% by weight makes achieving a homogeneous alloy unlikelier, and may give rise to phase separation, which causes separation of a rhenium phase or rhenium-rich phase. This impairs the properties of the nickel-rhenium alloy, while, in addition, oxidation of rhenium proceeds during firing, causing the alloy composition to change. Also, the rhenium oxide sublimating out of the internal electrode portions of the formed multilayer component is detrimental to the dielectric. When the rhenium content is kept within the above range, such problems do not occur, and there can be formed a stable surface oxide film comprising nickel oxide and rhenium oxide. In particular, the rhenium content ranges preferably from 1.0 to 8.0% by weight.

The alloy composition of the individual alloy particles that make up the nickel-rhenium alloy powder need not necessarily be homogeneous. For instance, the alloy particles may have a rhenium concentration gradient from the surface toward the interior of the particles.

The present invention does not exclude a case in which the nickel-rhenium alloy powder comprises a third component besides nickel as a main component and rhenium. A third component may be, for instance, metals that can be alloyed with rhenium, such as platinum, palladium, iron, cobalt, ruthenium, rhodium, etc., as well as small quantities of metal elements such as gold, silver, copper, tungsten, niobium, molybdenum, vanadium, chromium, zirconium, tantalum, etc. A light element capable of lowering the catalytic activity of nickel, such as sulfur, phosphorus or silicon, may also be present in small amounts.

When the average particle size of the nickel-rhenium alloy powder of the present invention is smaller then 0.05 μm, activity increases excessively and it becomes difficult to inhibit sintering at low temperature and/or resin decomposition at low temperature. Moreover, it is then necessary to use a large amount of organic components such as a solvent, a dispersant, etc., in order to carry out dispersion and achieve appropriate viscosity during manufacture of the conductor paste. As a result, this precludes achieving a dense electrode dry film during paste printing and drying, and makes it thus difficult to form a fired film having good continuity. On the other hand, from the viewpoint of achieving thinner layers in response to a demand for small, high layer-count multilayer electronic components, the average particle size of the nickel-rhenium alloy powder must be no greater than 1.0 μm. In order to form dense and highly smooth thin internal electrode layers, in particular, there is preferably used an extremely fine powder, having an average particle size of 0.05 to 0.5 μm and a specific surface area of 1.5 to 15 $m^2/g$, and possessing good dispersibility. Unless otherwise stated in the present invention, the average particle size of a powder denotes a specific surface area diameter calculated based on a specific surface area as measured by the BET method.

The alloy powder of the present invention allows forming a stable thin film comprising a nickel oxide and a rhenium oxide, by oxidizing a specific amount of nickel-rhenium alloy powder that contains a specific amount of rhenium, within the above specific particle size range. Besides a nickel oxide and a rhenium oxide, the surface oxide film may also contain an oxide of the above third component that is comprised in the alloy. The surface oxide film may contain a complex oxide comprising these alloying components, for instance a complex oxide of nickel and rhenium. The rhenium oxide contained in the surface oxide film is thought to be stabilized by being bonded to the nickel oxide.

This allows, as a result, lowering surface activity while curbing sintering of particles at a comparatively low temperature, where particle surface diffusion is a dominant factor, and allows shifting the sintering initiation temperature to a higher temperature, even in the case of a very fine powder. When such a nickel-rhenium alloy powder is used for forming the internal electrodes of a multilayer ceramic electronic component, therefore, formation of voids and expansion of such voids in the electrodes are believed to be suppressed as a result of the delay in sintering shrinkage initiation of the internal electrodes, and slowing down of sintering shrinkage progress at a low temperature range during firing of the multilayer ceramic electronic component. The surface oxide film, moreover suppresses further progress of oxidation during firing, and affords as a result excellent oxidation resistance. This prevents the occurrence of delamination and cracks, brought about by volume changes due to oxidation and reduction during firing.

The amount of surface oxide film is about 0.1 to 3.0% by weight as a proportion of the total oxygen amount comprised in the surface oxide film relative to the total weight of the alloy powder. In the present invention, the amount of oxygen in the surface oxide film is expressed by the amount of oxygen released upon heating the alloy powder to 900° C. in a reducing atmosphere, specifically by a value obtained by measuring, as the ignition-loss, a percentage weight change upon heating the powder from normal temperature to 900° C. in a reducing atmosphere composed of $N_2$ gas containing 4% of $H_2$, and then subtracting from the ignition loss the content of volatile elements other than oxygen that volatilize under such conditions, such as carbon and sulfur. When the oxygen amount is smaller than 0.1% by weight, the oxide film becomes thinner and fails to cover the entire surface, thereby diminishing the effect elicited by surface oxidation. An amount of oxygen in excess of 3.0% by weight leads to greater volume changes and generation of gas due to reduction of the oxide when the multilayer electronic component is fired in a reducing atmosphere. As a result, this precludes obtaining a dense electrode film, and may give rise to cracks and/or delamination. The amount of oxygen ranges preferably from 0.3 to 2.0% by weight. The surface oxide film is more effective when a thin oxide film having an average thickness no greater than about 30 nm covers the entire surface uniformly.

The stability of the oxide film, namely the approximate temperature up to which the oxide film is strongly bonded to the surface of the alloy powder particles, and the extent to which the oxide film covers the surface uniformly, can both be represented approximately by the shrinkage behavior during heating in a reducing atmosphere that is identical to the firing atmosphere. In a thermomechanical analysis (TMA) performed by heating a compact of the powder of the invention from room temperature to 1300° C. at a rate of 5° C./min in a reducing atmosphere composed of $N_2$ gas containing 4% of $H_2$, the temperature corresponding to a 20% shrinkage rate relative to the shrinkage rate at 1300° C. ranges preferably from 400 to 800° C., more preferably from 430 to 800° C., since the latter range is more effective in lowering the void fraction in the electrodes.

An oxide of silicon is preferably present in the surface oxide film, with a view to achieving a strong surface oxide film not likely to decompose at low temperature. When present in the form of an oxide in the surface oxide film of the nickel-rhenium alloy powder, silicon is believed to stabilize the oxide film by being combined with nickel oxide and/or rhenium oxide. The rhenium oxide are prevented thereby from sublimating on their own. Thereby as well, a firm oxide film is reliably preserved on the surface of the nickel-rhenium alloy powder up to a high temperature during firing. As a result, the powder exhibits yet superior sintering behavior and there can be formed thinner, excellent internal electrode layers free of voids and obtained a multilayer electronic component having few structural defects such as delamination and cracks.

Silicon has moreover the effect of allowing forming a uniform surface oxide film on the nickel-rhenium alloy powder, as described below. During surface oxidation of the nickel-rhenium alloy powder, the presence of a silicon component in the alloy powder allows forming reliably an oxide film that covers the entire surface of the alloy particles, very thinly and very uniformly, without oxidation progressing beyond necessity. This is believed to enhance, as a result, the effect of increasing the sintering suppressing action and oxidation resistance elicited by the powder.

The content of a silicon oxide in the oxide film ranges preferably from 10 to 10,000 ppm, more preferably from 100 to 5,000 ppm in terms of silicon atoms, relative to the total powder weight. A silicon oxide content below 10 ppm weakens the improving effect on stability that is elicited by the oxide film, while a content beyond 10,000 ppm exerts a nonnegligible influence on dielectric properties.

In the present invention, the nickel-rhenium alloy powder contains preferably a sulfur component. Preferably, sulfur segregates near the surface of the alloy particles. As explained above, the surface activity of the nickel-rhenium alloy powder is higher than that of pure nickel. This surface activity can be lowered by oxidizing the surface so as to prevent the pure metal surface from being exposed and by adding silicon, but further adding sulfur allows reducing surface activity very effectively. Addition of sulfur prevents for instance the occurrence of sudden resin decomposition caused due to catalytic action at low temperature during binder removal, and prevents the occurrence of structural defects and of residual carbon, averting thus the associated lowering of the strength of the ceramic body, electric performance, etc.

This action is believed to result from the fact that when sulfur is present near the surface of the alloy powder particles, and in particular, when a surface oxide film is present and sulfur is present at, for instance, sites where the surface oxide film is partially thin, the catalytic activity of the particle surface is lowered as a whole, and the sulfur strongly bonds to nickel so that it does not separate from the surface even when the surface oxide film is reduced in a strongly reducing atmosphere during binder removal.

Preferably, the content of sulfur is 100 to 2,000 ppm, in terms of sulfur atoms, relative to the total powder weight. A sulfur content below 100 ppm results in a weak effect of lowering the surface activity, whereas a sulfur content in excess of 2,000 ppm may be detrimental to dielectric properties and may give rise to nonnegligible damage to the furnace, caused by sulfur-containing gases that are generated during firing of the multilayer ceramic electronic component.

Manufacturing Method

The method for manufacturing the nickel-rhenium alloy powder of the present invention is not limited. The method may be, for instance, atomization, wet reduction, chemical vapor deposition (CVD) by gas-phase reduction of a metal compound, physical vapor deposition (PVD) by cooling and condensing a metal vapor. Also, there may be mentioned the method involving thermal decomposition of metal compounds, for instance, the method by the applicant disclosed in Japanese Patent Publication 2002-20809 A and others in which a thermally decomposable metal compound powder is pyrolyzed while dispersed in a gas phase, as well as the method by the applicant disclosed in Japanese Patent Publication 2007-138280 A (Japanese Patent Application 2006-71018). The method set forth in Japanese Patent Publication 2007-138280 A is particularly preferable, since it allows manufacturing a compositionally homogeneous fine nickel-rhenium alloy powder, easily and stably. In the manufacturing method proposed in Japanese Patent Publication 2007-138280 A, main-component metal particles of nickel or the like, in the form of a solid phase and/or liquid phase, are dispersed in a gas phase. Rhenium is deposited on the surface of these metal particles through reduction of a vapor of a rhenium oxide, and is caused to diffuse into the particles at a high temperature.

The method for forming the surface oxide film is not limited, and may involve forming a given amount of oxide on the surface of the alloy powder by subjecting the alloy powder to a thermal treatment in an oxidizing atmosphere while preventing agglomeration of the powder. Further, for instance, in the case of the vapor deposition method, the method involving pyrolyzing a thermally decomposable metal compound powder in a gas phase, as set forth in Japanese Patent Publication 2002-20809 A or others, the method set forth in Japanese Patent Publication 2002-20809 A or the like, in the course of cooling the alloy powder formed at high temperature, preferably an oxidizing gas such as air may be mixed while retaining the formed powder in a dispersed state in a gas phase because a homogeneous thin oxide film can be formed instantly without agglomeration of the powder. In such a way, the oxidation amount can be adjusted on the basis of, for instance, the temperature at which the formed particles and the oxidizing gas come into contact with each other. To form a thin, homogeneous and stable surface oxide film effectively there may be used the carbon-amount lowering method of the present applicant disclosed in Japanese Patent Publication 2007-157563 A (Japanese Patent Application 2005-352925), in which the amount of carbon impurities in a nickel-rhenium alloy powder is reduced. In that case, the carbon content is preferably controlled so that the weight ratio (in terms of carbon atoms) of carbon content relative to a unit weight of alloy powder does not exceed 200 ppm per 1 $m^2/g$ of the specific surface area of the powder.

To incorporate silicon on the surface oxide film, the surface of the nickel-rhenium alloy powder may for instance be brought into contact, after surface oxidation, with a silicon compound, followed by a thermal treatment. Alternative methods involve, for instance, subjecting a nickel-rhenium alloy powder, containing silicon beforehand, to a surface oxidation treatment, to cause at least part of the silicon to be taken up, in the form of an oxide, within the surface oxide film. For instance, in the case where an alloy powder formed at high temperature is dispersed in a gas phase, as described above, and is then surface-oxidized as-is with an oxidizing gas, having silicon incorporated beforehand in the alloy powder results in the silicon component being driven towards the surface of the nickel-rhenium alloy powder, whereby silicon becomes taken up into the oxide film. Thus, a surface oxide film comprising a silicon oxide can be formed. This method is preferable in that silicon has the effect of causing the surface oxide film to be formed uniformly on the nickel-rhenium alloy powder and allows formation of a thin oxide film uniformly coating the entire surface of the alloy particles therewith. In the above methods there are various ways of incorporating silicon beforehand into the nickel-rhenium alloy powder. For instance, in the manufacturing method disclosed in Japanese Patent Publication 2007-138280 A, a method for incorporating silicon beforehand into the starting-material nickel powder, or feeding a gaseous silicon compound, such as a silane compound or a siloxane compound, together with a rhenium oxide vapor or the like is preferably adopted.

Likewise, the method for incorporating sulfur is not limited. Such a method may involve, for instance, mixing the alloy powder and sulfur powder and heating the mixture in a hermetically closed container, or a method in which a sulfur-containing gas, such as hydrogen sulfide gas or sulfurous acid gas is made to react with an alloy powder by being made to flow through the latter. Further, in the vapor deposition method, the method involving pyrolyzing a thermally decomposable metal compound powder in a gas phase, as set forth in Japanese Patent Publication 2002-20809 A or others, the method set forth in Japanese Patent Publication 2007-138280 A or the like, a sulfur compound may be included in an alloy starting material, or a gas such as hydrogen sulfide gas, sulfurous acid gas or a gas of a mercaptan-based organic sulfur compound may be added into the reaction system, to yield a sulfur-containing nickel-rhenium alloy powder.

Conductor Paste

The conductor paste of the present invention contains at least the above nickel-rhenium alloy powder as a conductive powder. The conductor paste is obtained by dispersing the nickel-rhenium alloy powder in a vehicle comprising a resin binder and a solvent. The resin binder is not particularly limited, and may be a resin binder ordinarily used in conductor pastes, for instance ethyl cellulose, hydroxyethyl cellulose and other cellulose resins, as well as an acrylic resin, a methacrylic resin, a butyral resin, an epoxy resin, a phenolic resin, rosin or the like. The blending amount of the resin binder is not particularly limited, but is usually of about 1 to 15 parts by weight relative to 100 parts by weight of conductive powder. The solvent used is not particularly limited so long as it will dissolve the above binder resin, and may be appropriately selected from among solvents ordinarily used in conductor pastes. Examples thereof include organic solvents such as alcohols, ketones, ethers, esters, hydrocarbons and the like, as well as water and mixed solvents of the foregoing. The amount of solvent is not particularly limited, provided that it is an amount ordinarily employed. The amount of solvent is appropriately determined in accordance with, for instance, the nature of the conductive powder, the type of resin and the coating method. Ordinarily, the amount of solvent is of about 40 to 150 parts by weight per 100 parts by weight of conductive powder.

In addition to the above components, the conductor paste of the present invention can also arbitrarily contain, according to its intended use, any components that are ordinarily added, such as inorganic powders such as a ceramic that is the same as, or whose composition is similar to that of, ceramics contained in ceramic green sheets; and also glass, metal oxides such as alumina, silica, zirconia, copper oxide, manganese oxide and titanium oxide and montmorillonite; as well as metalorganic compounds, plasticizers, dispersants, surfactants and the like.

The conductor paste of the present invention is manufactured by kneading a nickel-rhenium alloy powder, together with other additive components, in a vehicle, in accordance with known methods, so that the nickel-rhenium alloy powder becomes homogeneously dispersed in the vehicle. The above paste form is not exclusive, and may be a paint or an ink form instead. In particular, the obtained conductor paste is suitable for forming internal electrodes of multilayer ceramic electronic components such as multilayer capacitors, multilayer inductors, multilayer actuators and the like. The conductor paste of the present invention can also be used in terminal electrodes of ceramic electronic components, and in the formation of other thick-film conductor circuits.

EXAMPLES

The present invention is explained next in detail on the basis of examples. The invention, however, is in no way meant to be limited to or by the examples.

Examples 1 to 6

A powder of nickel acetate tetrahydrate was fed to a jet-mill at a feed rate of 2000 g/hr, and was pulverized and dispersed with nitrogen gas at a flow rate of 200 L/min.

Separately, a rhenium oxide ($Re_2O_7$) was heated to 300° C. to generate a rhenium oxide vapor that was fed into the gas stream in which the above-mentioned nickel acetate powder had been dispersed, at a rate of about 25 g/hr in terms of rhenium metal, using nitrogen gas at a flow rate of 10 L/min as a carrier. The dispersed gas stream was introduced into a reaction tube in an electric furnace heated to 1550° C. After passing through the electric furnace, the gas stream was cooled to about 100° C., after which the produced powder was recovered with a bag filter. Air inlet pipes were provided in the cooling line, to oxidize the surface of the produced powder through infusion of air. The surface oxidation amount of the formed powder was controlled by providing the plural air inlet pipes in the direction of the gas stream, and by changing the temperature at which the formed particles come into contact with air depending on the position of the inlet pipes.

Observation under a scanning electron microscope (SEM) revealed that the powders thus produced were composed of, in all cases, spherical particles having a uniform particle size (about 0.3 μm or smaller in average particle size) and having good dispersibility. Observation under a scanning transmission electron microscope (STEM) revealed that an oxide film was formed on the particle surface. Inspection by electron spectroscopy for chemical analysis (ESCA) revealed that the surface oxide film contained nickel oxide and rhenium oxide. The average thickness of the surface oxide film was about several nm to 30 nm. Analysis of the powder using an X-ray diffractometer revealed that the nickel diffraction lines were slightly shifted to lower angles, while no diffraction lines were observed other than those of nickel. This indicated that rhenium was alloyed with nickel in a solid solution state.

Table 1 summarizes the specific surface area, average particle size, rhenium content, silicon content, oxygen content, sulfur content and carbon content for each of the obtained powders. The specific surface area was measured in accordance with the BET method. The average particle size was converted from the specific surface area. The rhenium content and the silicon content were quantified by inductively coupled plasma spectrometry (ICP). To measure the oxygen content, about 2 g of the powder was weighed on an alumina boat and the percentage weight change (%) (ignition loss) when heating the powder from normal temperature up to 900° C. in $N_2$ gas containing 4% of $H_2$ followed by cooling it to room temperature was measured. The carbon content and the sulfur content were subtracted from the measured ignition loss, to yield the oxygen content value. The sulfur and carbon contents were measured using a carbon-sulfur analyzer (EMIA-320V, by Horiba Ltd.). The traces of silicon and sulfur detected in these examples are considered to be impurities arising from the starting materials or introduced during the process.

Measurement of Powder Properties

The sintering shrinkage behavior of each powder was studied as follows. The powder was molded into a cylindrical specimen having a diameter of 5 mm and a height of approximately 3 mm, and TMA was carried out by heating the specimen from room temperature to 1300° C. at a temperature rise rate of 5° C./min in $N_2$ gas containing 4% of $H_2$. On the basis of the measurement results, the temperature corresponding to a 20% shrinkage relative to the shrinkage at 1300° C. is given in Table 1 as the TMA shrinkage temperature.

The binder removal characteristic of the conductor paste was evaluated as follows. 100 parts by weight of the obtained nickel-rhenium alloy powder, 5 parts by weight of ethyl cellulose as the resin binder and 95 parts by weight of dihydroterpineol as the solvent were blended and kneaded using a 3-roll mill to prepare a conductor paste. The obtained conductor paste was coated onto a PET film, to a thickness of 250 μm, and was dried at 150° C. to remove the solvent. The dry film was heated to 500° C. in a nitrogen gas atmosphere at a temperature rise rate of 20° C. per minute and subjected to thermogravimetric measurement to examine the decomposition initiation temperature of the resin. The thus obtained decomposition initiation temperature is shown as the binder removal temperature in Table 1.

The continuity of the fired film (fired film coverage) was measured as follows. 100 parts by weight of the nickel-rhenium alloy powder, 20 parts by weight of barium titanate powder of 50 nm, 5 parts by weight of ethyl cellulose and 95 parts by weight of dihydroterpineol were mixed and kneaded using a 3-roll mill to prepare a conductor paste. The obtained conductor paste was coated onto an alumina substrate to a coating amount of 0.8 mg/cm$^3$, on metal basis, and fired at 1200° C. in $N_2$ gas containing 4% of $H_2$. The fired film was examined by SEM, and the observed images were processed to measure the substrate coverage of the fired film as given in Table 1, where larger figures denote better continuity.

Examples 7 to 8

Nickel-rhenium alloy powders were manufactured under the same conditions as in Examples 1 to 6 except that a tetraethoxysilane solution diluted with isopropyl alcohol was vaporized by way of heated nitrogen gas at a flow rate of 10 L/min and fed into the gas stream having the nickel acetate powder dispersed therein, in addition to the rhenium oxide vapor.

Similarly, analysis performed on the obtained powders revealed that in all cases the powders were alloy powders composed of spherical particles of uniform particle size, exhibiting good dispersibility, and having the entire surface covered with an oxide film of a more uniform thickness than that of Examples 1 to 6. An ESCA analysis revealed that the surface oxide film contained nickel oxide, rhenium oxide and silicon oxide. The average thickness of the oxide film was about 10 nm to about 20 nm.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the obtained powders, measured in the same way as in Examples 1 to 6.

Examples 9 to 10

Nickel-rhenium alloy powders were manufactured under the same conditions as in Examples 7 to 8 except that hydrogen sulfide gas diluted with nitrogen gas was fed also into the gas stream of dispersed nickel acetate powder, in addition to rhenium oxide vapor and tetraethoxysilane vapor.

Similarly, analysis on the obtained powders revealed that in all cases the powders were alloy powders composed of spherical particles of uniform particle size, exhibiting good dispersibility, and having a surface oxide film of uniform thickness averaging at about 10 nm to 20 nm. An ESCA analysis revealed that the surface oxide film contained nickel oxide, rhenium oxide and silicon oxide, and that sulfur was present near the surface of the particles.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the obtained powders, measured in the same way as in Examples 1 to 6.

Examples 11 to 12

Alloy powders having different rhenium contents and sulfur contents were manufactured under the same conditions as in Examples 1 to 6, but varying the feed amount of rhenium oxide vapor and feeding also hydrogen sulfide gas, diluted with nitrogen gas, in addition to rhenium oxide vapor.

Similarly, analysis on the obtained powders revealed that in all cases the powders were nickel-rhenium alloy powders composed of spherical particles of uniform particle size, exhibiting good dispersibility, and having a surface oxide film of uniform thickness averaging at about 20 nm. Analysis revealed that the surface oxide film contained nickel oxide and rhenium oxide, and that sulfur was present near the surface of the particles.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the obtained powders, measured in the same way as in Examples 1 to 6.

Example 13

A nickel-rhenium alloy powder was manufactured under the same conditions as in Examples 1 to 6, but with the feed rate of nickel acetate tetrahydrate being now 5000 g/hr and the feed rate of rhenium oxide vapor being about 60 g/hr, in terms of rhenium metal.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the obtained powder, measured in the same way as in Examples 1 to 6.

Example 14

A nickel-rhenium alloy powder was manufactured under the same conditions as in Examples 11 to 12 but with the feed rate of nickel acetate tetrahydrate being now 200 g/hr and the feed rate of rhenium oxide vapor being about 2.5 g/hr, in terms of rhenium metal.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for the obtained powder, measured in the same way as in Examples 1 to 6.

Comparative Examples 1 to 2

Nickel-rhenium alloy powders were manufactured under the same conditions as in Examples 1 to 6, but changing the amount of surface oxidation.

Comparative Example 3

A nickel powder having a surface oxide film was manufactured under the same conditions as in Examples 1 to 6, but without feeding any rhenium oxide vapor.

Table 1 summarizes the specific surface area, average particle size, rhenium content, silicon content, oxygen content, sulfur content, carbon content, TMA shrinkage temperature and binder removal temperature of the conductor paste, and substrate coverage of the fired film for each of the powders obtained in Comparative Examples 1 to 3, measured in the same way as in Examples 1 to 6.

A comparison between the results of Examples 1 to 6 and Comparative Examples 1 to 2 in Table 1 reveals that, within the range of the present invention, a greater surface oxidation amount of the particles is accompanied by a rise in TMA shrinkage temperature and an increase in coverage of the fired films. As Comparative Example 2 shows, however, coverage drops when the amount of surface oxidation is excessive. In the examples, continuity of fired films was evaluated by judging that a coverage of 70% or more corresponds to a practical level for use in electrodes of multilayer ceramic capacitors. Therefore, the oxygen content must be 0.1 to 3.0% by weight relative to the total weight of the powder. Excellent electrodes are obtained when the TMA shrinkage temperature is 400° C. or higher, and even yet superior electrodes are obtained when the TMA shrinkage temperature is 430° C. or higher.

As regards the binder removal temperature, the results of Examples 1 to 6 and the comparative examples indicate that the greater the oxygen content, the more the binder removal activity is suppressed, and hence the higher the binder removal temperature is. Examples 7 to 10 show that inclusion of silicon causes the TMA shrinkage temperature to rise and the coverage of the fired film to increase. The results of Examples 9 to 10 indicate that the binder removal temperature can be increased by adding sulfur, even when the oxygen content is comparatively low. In Example 10, adding suitable amounts of both silicon and sulfur makes it possible to effectively achieve improvement in the coverage of the fired film and suppression of binder removal activity. The results of Comparative Example 3 indicate that the effect of the present invention cannot be obtained when the nickel powder contains no rhenium.

TABLE 1

| | Specific surface area ($m^2/g$) | Average particle size (μm) | Rhenium content (% by weight) | Silicon content (ppm) | Oxygen content (% by weight) | Sulfur content (ppm) | Carbon content (ppm) | TMA shrinkage temperature (° C.) | Binder removal temperature (° C.) | Fired film coverage (%) |
|---|---|---|---|---|---|---|---|---|---|---|
| Example 1 | 2.9 | 0.23 | 5.3 | 40 | 0.14 | 40 | 380 | 360 | 295 | 70 |
| Example 2 | 2.9 | 0.23 | 5.2 | 40 | 0.31 | 50 | 380 | 400 | 304 | 75 |
| Example 3 | 2.6 | 0.26 | 5.1 | 40 | 0.52 | 50 | 310 | 420 | 317 | 78 |
| Example 4 | 2.9 | 0.23 | 5.3 | 40 | 0.75 | 50 | 300 | 430 | 323 | 81 |
| Example 5 | 3.0 | 0.22 | 5.3 | 40 | 1.38 | 50 | 170 | 460 | 346 | 85 |
| Example 6 | 3.2 | 0.21 | 5.2 | 40 | 3.00 | 50 | 150 | 480 | 359 | 77 |
| Example 7 | 2.8 | 0.24 | 5.1 | 1080 | 0.33 | 50 | 250 | 630 | 336 | 88 |
| Example 8 | 2.8 | 0.24 | 5.0 | 1100 | 1.05 | 50 | 210 | 680 | 352 | 93 |
| Example 9 | 2.7 | 0.25 | 5.1 | 150 | 0.51 | 1030 | 110 | 550 | 366 | 89 |
| Example 10 | 2.7 | 0.25 | 5.2 | 760 | 0.76 | 700 | 190 | 640 | 368 | 93 |
| Example 11 | 2.8 | 0.24 | 3.4 | 40 | 1.26 | 690 | 230 | 430 | 367 | 80 |
| Example 12 | 2.9 | 0.23 | 1.5 | 40 | 1.29 | 720 | 210 | 410 | 368 | 78 |
| Example 13 | 1.0 | 0.67 | 5.0 | 40 | 0.48 | 40 | 240 | 430 | 321 | 76 |
| Example 14 | 6.0 | 0.11 | 4.9 | 40 | 1.86 | 1190 | 220 | 400 | 365 | 87 |

TABLE 1-continued

| | Specific surface area (m²/g) | Average particle size (μm) | Rhenium content (% by weight) | Silicon content (ppm) | Oxygen content (% by weight) | Sulfur content (ppm) | Carbon content (ppm) | TMA shrinkage temperature (° C.) | Binder removal temperature (° C.) | Fired film coverage (%) |
|---|---|---|---|---|---|---|---|---|---|---|
| Comparative Example 1 | 2.8 | 0.24 | 5.0 | 40 | 0.06 | 40 | 420 | 330 | 282 | 62 |
| Comparative Example 2 | 3.0 | 0.22 | 5.1 | 40 | 3.48 | 40 | 140 | 490 | 361 | 68 |
| Comparative Example 3 | 2.8 | 0.24 | 0.0 | 40 | 1.34 | 40 | 210 | 380 | 350 | 60 |

The invention claimed is:

1. A nickel-rhenium alloy powder comprising nickel as a main component, 0.1 to 10% by weight of rhenium, and having an average particle size of 0.05 to 1.0 μm, wherein the nickel-rhenium alloy powder has a surface oxide film comprising a nickel oxide and a rhenium oxide, and an amount of oxygen in the surface oxide film is 0.1 to 3.0% by weight relative to a total weight of the powder.

2. The nickel-rhenium alloy powder according to claim 1, wherein in a TMA measurement performed by heating the nickel-rhenium alloy powder from room temperature to 1300° C. at a rate of 5° C./min in a nitrogen-hydrogen reducing atmosphere, the temperature at which the powder exhibits a 20% shrinkage rate, relative to the shrinkage rate at 1300° C., ranges from 400 to 800° C.

3. The nickel-rhenium alloy powder according to claim 1, wherein a silicon oxide is present in the surface oxide film.

4. The nickel-rhenium alloy powder according to claim 1, wherein the nickel-rhenium alloy powder further contains sulfur.

5. The nickel-rhenium alloy powder according to claim 4, wherein the sulfur segregates near the surface of the powder.

6. The nickel-rhenium alloy powder according to claim 4, wherein a content of the sulfur is 100 to 2,000 ppm, in terms of sulfur atoms, relative to the total weight of the powder.

7. A conductor paste for forming internal electrodes of a multilayer ceramic electronic component, comprising at least the nickel-rhenium alloy powder according to claim 1, as a conductive powder.

* * * * *